(12) United States Patent
Habenicht et al.

(10) Patent No.: US 9,466,688 B2
(45) Date of Patent: Oct. 11, 2016

(54) SEMICONDUCTOR DEVICE WITH MULTILAYER CONTACT AND METHOD OF MANUFACTURING THE SAME

(71) Applicant: NXP B.V., Eindhoven (NL)

(72) Inventors: Soenke Habenicht, Hamburg (DE);
Detlef Oelgeschlager, Hamburg (DE);
Olrik Schumacher, Hamburg (DE);
Stefan Bengt Berglund, Hamburg (DE)

(73) Assignee: NXP B.V., Austin, TX (US)

( * ) Notice: Subject to any disclaimer, the term of this patent is extended or adjusted under 35 U.S.C. 154(b) by 0 days.

(21) Appl. No.: 15/089,857

(22) Filed: Apr. 4, 2016

(65) Prior Publication Data

US 2016/0218193 A1    Jul. 28, 2016

Related U.S. Application Data

(62) Division of application No. 13/512,366, filed as application No. PCT/IB2009/055864 on Dec. 21, 2009, now Pat. No. 9,331,186.

(51) Int. Cl.
| | |
|---|---|
| *H01L 21/8249* | (2006.01) |
| *H01L 29/66* | (2006.01) |
| *H01L 29/08* | (2006.01) |
| *H01L 29/10* | (2006.01) |
| *H01L 29/417* | (2006.01) |

(52) U.S. Cl.
CPC ..... *H01L 29/66303* (2013.01); *H01L 29/0813* (2013.01); *H01L 29/1004* (2013.01); *H01L 29/41708* (2013.01)

(58) Field of Classification Search
CPC .................................................. H01L 29/0804
USPC .......................................................... 438/235
See application file for complete search history.

(56) References Cited

U.S. PATENT DOCUMENTS

| | | |
|---|---|---|
| 4,205,332 A | 5/1980 | Conti et al. |
| 5,032,887 A | 7/1991 | Oliveri et al. |
| 5,986,326 A | 11/1999 | Kato |
| 2002/0135046 A1 | 9/2002 | Yu |
| 2005/0016778 A1 | 1/2005 | Kitano et al. |
| 2005/0212088 A1 | 9/2005 | Akaki |
| 2008/0217785 A1 | 9/2008 | Habenicht et al. |
| 2008/0251907 A1 | 10/2008 | Habenicht et al. |
| 2009/0057685 A1 | 3/2009 | Mochizuki et al. |

FOREIGN PATENT DOCUMENTS

| | | |
|---|---|---|
| CN | 1930679 | 3/2007 |
| JP | 669216 A | 3/1994 |
| JP | 936347 A | 2/1997 |
| JP | 200767128 A | 3/2007 |
| JP | 2007527120 A | 9/2007 |
| WO | 2005088707 A1 | 9/2005 |
| WO | 2007017786 A2 | 2/2007 |

OTHER PUBLICATIONS

International Search Report for Application No. PCT/IB2009/055864 (Dec. 21, 2009).

*Primary Examiner* — Samuel Gebremariam

(57) ABSTRACT

The present invention provides a semiconductor with a multilayered contact structure. The multilayered structure includes a metal contact placed on an active region of a semiconductor and a metal contact extension placed on the metal contact.

20 Claims, 6 Drawing Sheets

SEMICONDUCTOR DEVICE WITH MULTILAYER CONTACT AND METHOD OF MANUFACTURING THE SAME

CROSS-REFERENCE TO RELATED APPLICATIONS

This application is a divisional of U.S. patent application Ser. No. 13/512,366, having a filing date of May 29, 2012, which is the National Stage of International Application No. PCT/IB2009/055864, having a filing date of Dec. 21, 2009, a common inventor, and a common assignee, all of which is incorporated by reference in its entirety.

BACKGROUND

Power bipolar transistors carry and switch high current densities on a semiconductor chip with low losses. By applying a low steering current on the base, a significantly higher current is achieved between emitter and collector. Important in this context is the minimization of the resistance during switching, otherwise known as the saturation resistance, because it defines losses during switching. The thermal power dissipation limits the maximum current capable for the device and therefore defines the possible fields of application.

Contributions to the saturation resistance of a bipolar transistor include the doping profiles of base and emitter, the thickness of the epitaxial layer defining the breakdown voltage, and the ohmic contributions of emitter, base, and collector. In bipolar transistors, the base and emitter resistances may be optimized, because the base resistance contributes to the saturation resistance via the voltage drop and the field in the base. In field effect transistors (FET), different materials can be used for source and gate contacting without significant loss of performance. Poly-silicon layers may be used for gate-contacts of a FET. Poly-silicon has a lower conductivity compared to metal layers, but as the gate current can be neglected, the performance is acceptable with a significant advantage in terms of processability and lifetime stability.

Bipolar transistors contact base and emitter via low-ohmic metal layers, aiming at realization of a homogeneous, low ohmic connection of the active layers. Ohmic base and emitter resistances of bipolar transistors may be adjusted by varying the size of the contact area. When semiconductor size is constrained, the optimization of the ohmic emitter resistance of a bipolar transistor in the contact plane is limited due to the base contact and bond pad consuming a defined area on the semiconductor surface.

The present invention may address one or more of the above issues.

SUMMARY

The present invention is exemplified in a number of implementations and applications, some of which are summarized below.

Consistent with an example embodiment of the disclosure, a bipolar transistor semiconductor device is provided. The bipolar transistor semiconductor device includes a first substrate layer including a collector region of a first conductivity type and a second substrate layer over and on the first substrate layer. The second substrate layer includes a base region of a second conductivity type. The bipolar transistor semiconductor device also includes an emitter region of the first conductivity type in an upper region of the second substrate layer and an emitter contact over the second substrate layer and coupled to the emitter region. A base contact is included over the second substrate layer and coupled to the base region. A passivation layer is included over the base contact and an extension contact is included over and electrically coupled to the emitter contact region. The extension contact has a bottom surface that, with an upper surface of the emitter contact region, forms an interface configured to provide less spreading resistance than the emitter contact region.

In another embodiment, a bipolar transistor semiconductor device is provided. The bipolar transistor semiconductor device includes a first substrate layer including a collector region of a first conductivity type and a second substrate layer over and on the first substrate layer. The second substrate layer includes a base region of a second conductivity type in a top surface of the second substrate layer and an emitter region of a first conductivity type in the top surface of the second substrate layer. The bipolar transistor semiconductor device further includes an emitter contact over the second substrate layer and coupled to the emitter region as well as a base contact over the second substrate layer and coupled to the base region. A passivation layer is included over the base and emitter contact regions. An extension contact is included over the passivation layer, the extension contact extending through the passivation layer to electrically couple to the emitter contact region.

In yet another embodiment of the present invention, a method of constructing a bipolar transistor semiconductor device is provided. A first substrate layer including a collector region of a first conductivity type is formed and a second substrate layer is formed over and on the first substrate layer. The second substrate layer includes a base region of a second conductivity type in an active area of the second substrate layer. An emitter region of the first conductivity type is embedded in a top surface of the base region and a metal emitter contact is embedded over and on the emitter region.

A metal base contact is deposited over and on the base region. A passivation layer is formed over and on the metal base contact and over and on the metal emitter contact region. A metal emitter contact extension is deposited over and on the metal emitter contact region.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which:

FIGS. 2-1 and 2-2 illustrate respective top and side views of the bipolar transistor of FIG. 1 with emitter and base contact regions placed on respective emitter and base regions;

FIGS. 3-1 and 3-2 illustrate respective top and side views of the bipolar transistor of FIGS. 2-1 and 2-2 with a passivation layer 314 formed over the active area;

FIGS. 4-1 and 4-2 illustrate respective top and side views of the bipolar transistor of FIGS. 3-1 and 3-2 with an emitter contact extension formed over the emitter contact;

FIGS. 5-1 and 5-2 illustrate respective top and side views of the bipolar transistor of FIGS. 4-1 and 4-2 with an emitter contact extension formed over the active area;

FIG. 6-1 illustrates the top view of the bipolar transistor having an emitter region encircling the base region in a top surface of the base region;

FIG. 6-2 illustrates the top view of the bipolar transistor of FIG. 6-1 with emitter and base contact regions placed over respective emitter and contact regions;

FIG. 6-3 illustrates the top view of the bipolar transistor of FIG. 6-2 with extended emitter contact placed over the emitter contact region; and FIG. 6-4 illustrates the top view of the bipolar transistor of FIG. 6-2 with the extended emitter contact extending over the active area.

Figure 1:
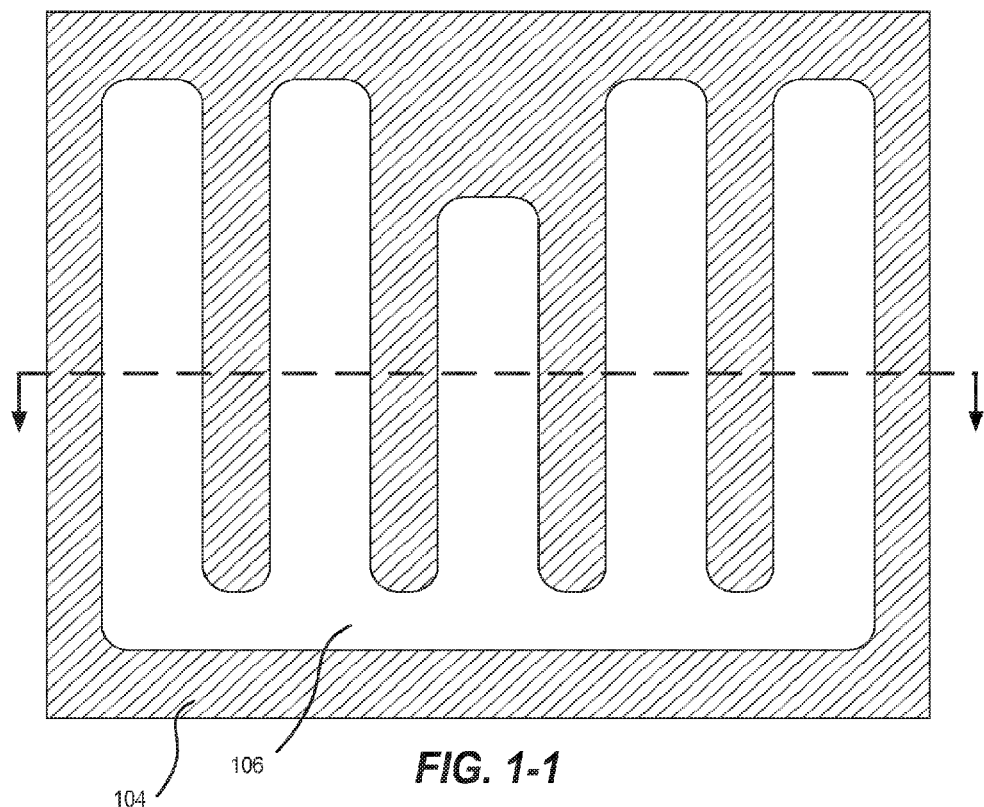
FIGS. 1-1 and 1-2 illustrate respective top and side views of a bipolar transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the appended claims.

DETAILED DESCRIPTION

The present invention is believed to be applicable to a variety of different types of semiconductor transistor devices and contacts. While the present invention is not necessarily so limited, various aspects of the invention may be appreciated through a discussion of examples using this context.

The various embodiments of the disclosure provide a semiconductor with a multilayer contact structure. As an example application of an embodiment of the disclosure, a transistor may be packaged in a small outline transistor package having a signal lead line for connecting to the emitter of the transistor to an external pin of the transistor package. The example transistor semiconductor device includes a collector region in a first substrate layer and base and emitter regions in a second substrate layer over and on the first substrate layer. Base and emitter contacts are included over and coupled to the respective base and emitter regions. An extension contact is included over and electrically coupled to the emitter contact for electrically coupling the signal lead line of the package to a large area of the emitter contact. Various embodiment of the disclosure refer to the extension contact as the emitter contact extension and such terms are used interchangeably herein.

Emitter area and base-emitter contact area are parameters that may be adjusted to optimize the ohmic resistance of the emitter and base contact, and therein can be used to adjust the current specification. Contact of base and emitter areas are realized simultaneously by a contact metal layer formed from a conductive material such as Al, Al/Si or Al/Si/Cu. For a low saturation resistance and a high current capability, a maximized emitter contact area allows the contact resistance to be minimized. The contact area between a contact and an active area coupled to the contact is also referred to as the contact interface and such terms are used interchangeably herein.

Electrical spreading resistance ("spreading resistance") also contributes to the ohmic resistance of semiconductor contacts. Spreading resistance is a resistance induced in a larger conductive area when electron mobility flows from a small conductive area to the large conductive area. This situation is present when the contact interface is smaller than the total area of the active semiconductor region coupled to the contact interface. The resistance is presented due to the spreading or propagation of electron mobility that takes place in the semiconductor region. The spreading resistance $R_{sp}$ of a flat, non-indenting circular top contact of radius r on the surface of a semiconductor material can be approximated by:

$$R_{SP} = \frac{R_S}{2\pi \cdot r} \arctan\frac{2t}{r}$$

Wherein $R_{SP}$ is the resistivity of the semiconductor material and t is the thickness t of the semiconductor material in which spreading occurs.

For a rectangular contact with corner lengths a, b and a relative thick semiconducting layer, contact resistance $R_K$ can be approximated by:

$$R_K = \sqrt{\rho_K R_S} \frac{1}{b} \coth\sqrt{\frac{R_S}{\rho_K}} a + C_1$$

Wherein $\rho_K$ is the contact resistivity, $R_S$ is the semiconductor resistivity, and $C_1$ is a correction factor for homogeneity of current flow.

A spreading resistance is also present in the metal contact itself Spreading resistance $R_{SP}$ in a circular metal layer with relative small contact radius can be more accurately approximated by:

$$R_{sp} = \frac{C}{d}\rho_M\left[\ln\frac{R}{R_1}\right]$$

Wherein d is the thickness of the metal contact, $\rho_M$ is the resistivity of the metal contact, R is the radius of the metal layer and $R_1$ is the radius of the contact interface area. The spreading resistance in the contact comes from the spreading of electron mobility through the metal contact starting from the leads coupling the metal contact to the semiconductor package. When a thin metal contact layer is used, the small thickness t of the metal contact layer causes a spreading resistance in the metal contact as currents propagate throughout the metal contact. Therefore, the spreading resistance of the metal contact, and in turn the total ohmic resistance of the contact interface, can be reduced by increasing the thickness of the metal contact.

However, the layer thickness of a single metal contact layer is also limited because, for processing reasons, a large contact thickness would result in unacceptably large distances between different polarities on the surface of the transistor chip. Additionally, thick metal contact layers result in high metal steps and large surface topographies, which have a negative impact on forthcoming process steps, e.g. the passivation layers and the encapsulating mould compound of the semiconductor product. The passivation layers have to cover the high metal steps and have to be robust against thermo-mechanical stress coming from the shear forces induced by the mould compound covering the semiconductor chip.

In various embodiments of the disclosure, a multilayer metal contact is included in the provided semiconductor device. The multilayer metal contact includes a second thicker metal layer contact on top of a first thin metal contact layer. Depending on the dimensions of the contact configuration, the addition of the second metal layer may reduce the spreading resistance of the emitter contact as well as the contact contribution to the ohmic resistance of the base and emitter contacts. This second metal layer on the thin emitter contact allows the current to flow laterally on the chip surface through a much larger area than for the first contact layer only. By this design, the ohmic resistance of the emitter, and therein the saturation resistance of the device in total, may be reduced in comparison to the single layer contact.

In some embodiments, the metal contacts in a first thin contact metallization layer may be overlapped by the thick emitter metal layer. These layers may be separated by small distances allowing for the further reduction of the emitter resistance.

In some other embodiments, connection line bars to the emitter may be placed in the second contact layer to increase the area available for the emitter contact interface areas in the first contact layer. The additional area allows the emitter ohmic resistance to be further optimized by increasing the contact interface area of a transistor emitter. In some embodiments, the spare areas between the base areas may be used for the emitter contact, which decreases the emitter resistance. The first contact metal layer can be protected against mechanical and electrochemical treatments by an isolation and passivation layer formed of materials such as silicon-oxide or silicon-nitride.

The various embodiments of the disclosure are thought to be applicable to a variety of applications that make use of semiconductor contacts, and particularly applicable to bipolar transistors. The various embodiments may be realized in discrete devices or as part of integrated circuits on a semiconductor chip. While the present invention is not necessarily limited to such applications, an appreciation of various aspects of the invention is best gained through a discussion of examples in such an environment. FIGS. 1 through 5 show various aspects and components of an example bipolar transistor that may be constructed in accordance with various embodiments of the present invention.

Figures 1, 2:
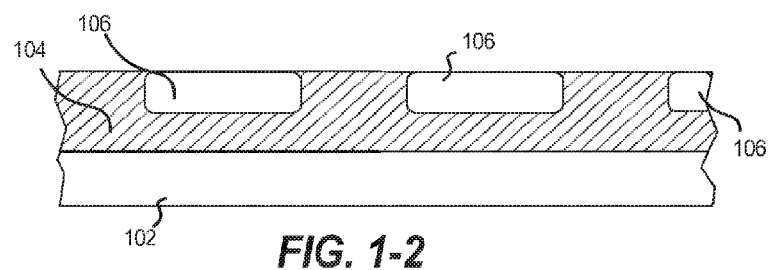
Figures 1, 2:
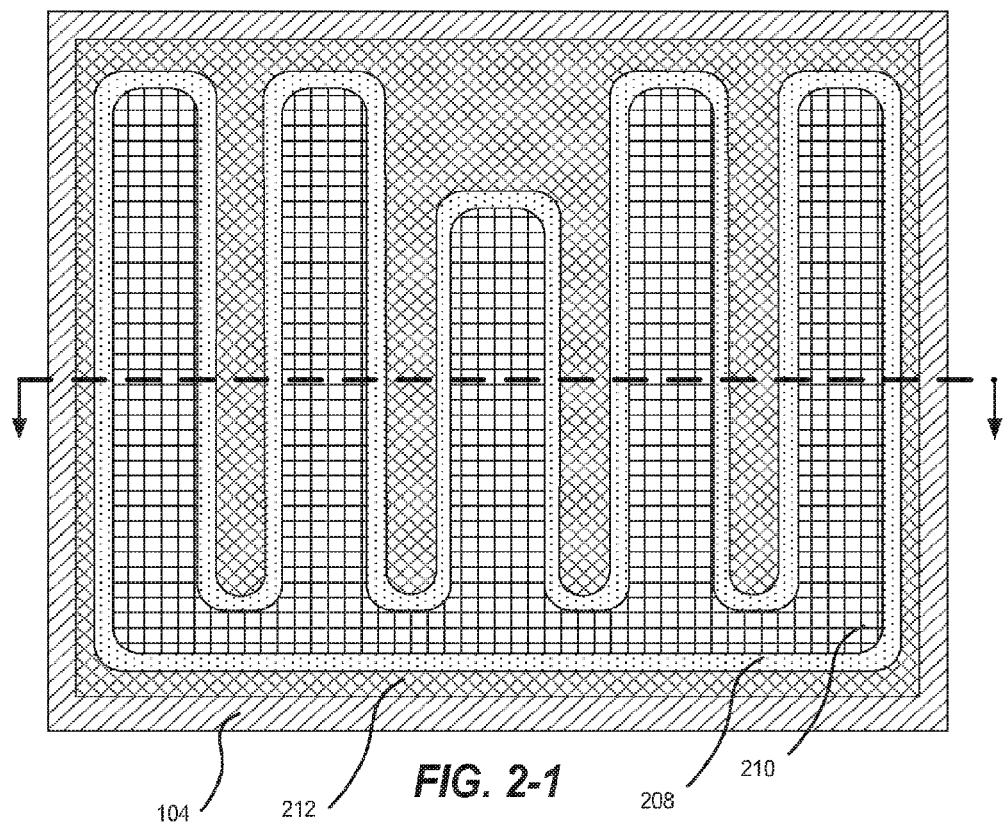
Figure 2:
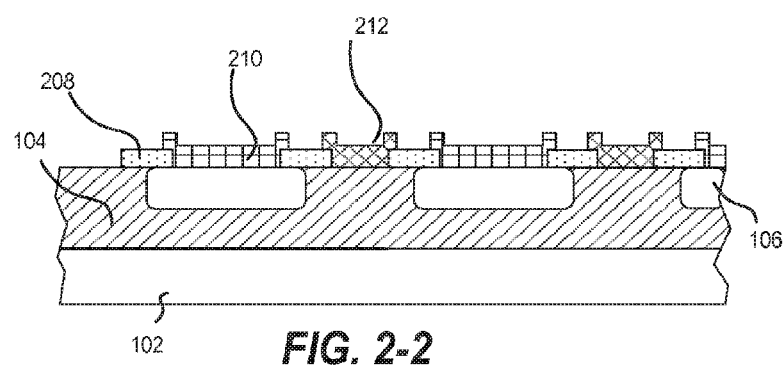

FIGS. 1-1 and 1-2 illustrate respective top and side views of a bipolar transistor with emitter 106, base 104, and collector 102 regions. The emitter region shown is embedded in the base region and shaped such that a comb shaped emitter region is formed in the top surface of the base. It is understood that the embedded emitter region may be formed to create any number of shapes in the top surface. In some embodiments, the several emitter regions may be embedded in the base region.

FIGS. 2-1 and 2-2 illustrate respective top and side views of the bipolar transistor of FIG. 1 with emitter contact 210 and base contact 212 placed on respective emitter and base regions 106 and 104. Isolation region 208 separates emitter and base contacts.

Figures 1, 3:
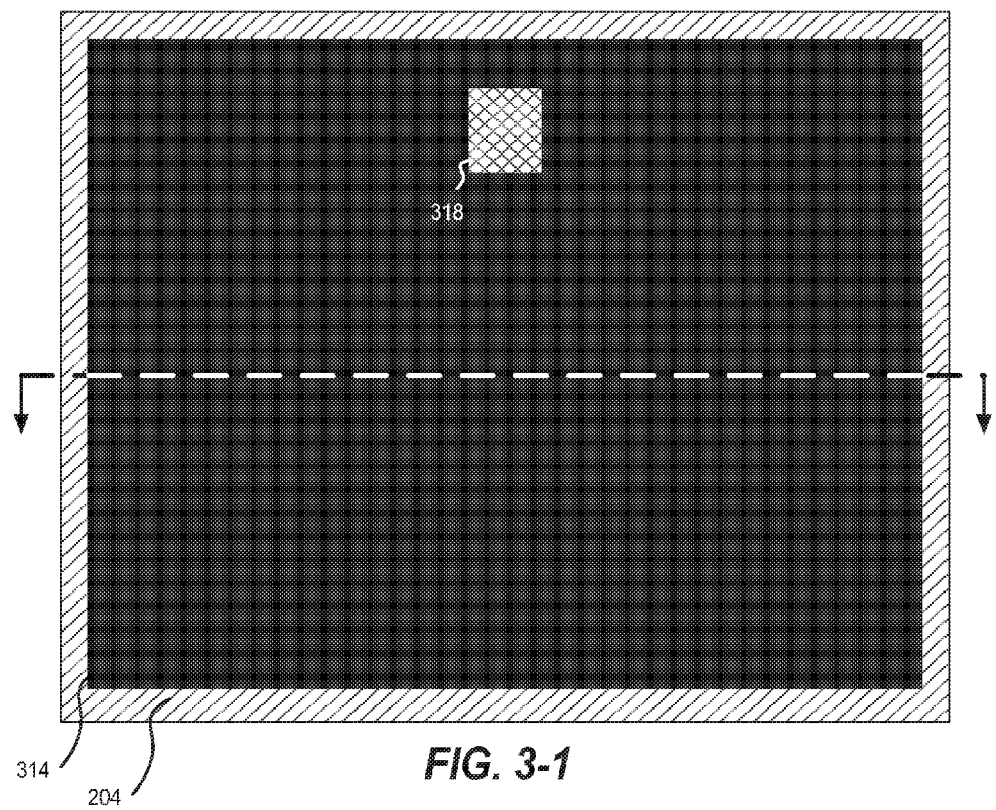
Figures 2, 3:
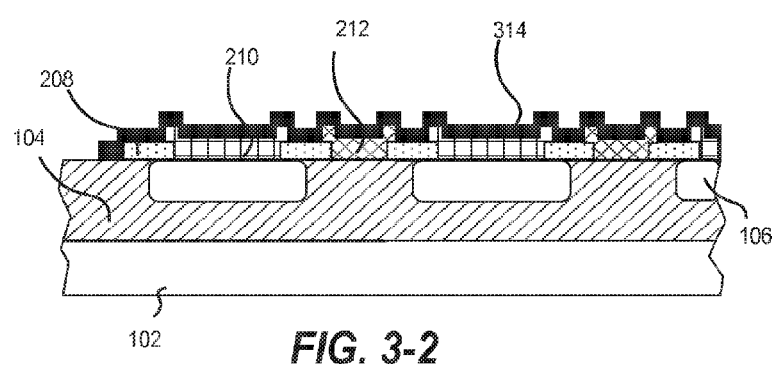

FIGS. 3-1 and 3-2 illustrate respective top and side views of the bipolar transistor of FIG. 2 with a passivation layer 314 formed over the active area. The passivation layer 314 on top of the metal contacts acts as a protection against mechanical treatments and shorts between the polarities. The passivation layer additionally helps to protect the active area against ionic diffusion. The passivation layer is generally formed from a non-conductive material such as silicon-oxide or silicon-nitride. Openings for contact pad 318 are formed in the passivation layer 314. In various embodiments, the isolation region 212 may be omitted and the passivation layer may be used to isolate emitter and base contact regions 210 and 212.

Figures 1, 4:
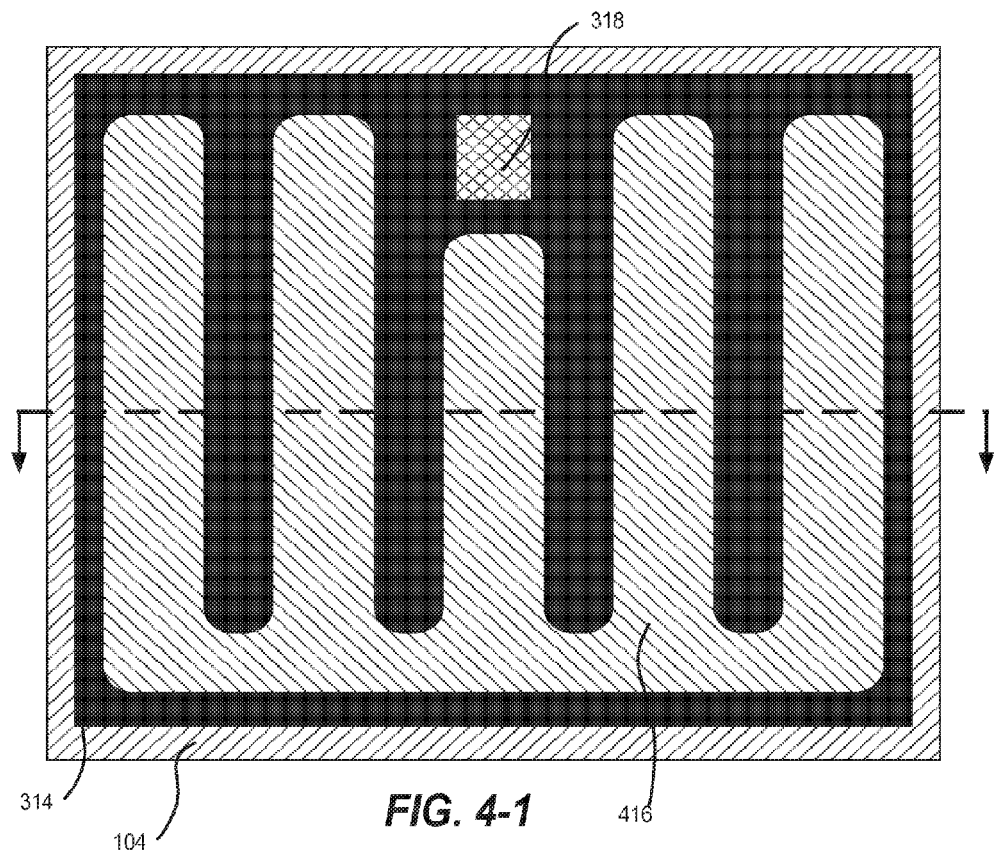
Figures 2, 4:
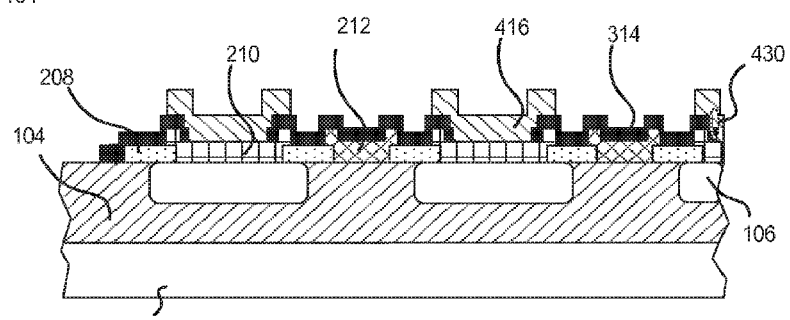

FIGS. 4-1 and 4-2 illustrate respective top and side views of the bipolar transistor of FIG. 3 with emitter contact extension 416 formed over the emitter contact 210. The passivation layer 314 is opened above the emitter metal contact 210 resulting in a via between both layers. This second metal layer is significantly thicker than the contact metal layer in order to realize a small spreading resistance through the first and second metal contact layers. The emitter contact extension layer may be formed of a conductive material such as Al, Al/Si, Al/Si/Cu, Ti or WTi in order to secure lifetime stability of the die.

Care should be given when utilizing the disclosed double layer metal contact because the distance between the metal layers of different polarities is very small. An emitter contact extension layer coupled to the emitter contact may overlap the metal contact coupled to the base. In such a situation, the base metal contact and the emitter contact extension layer may be separated only by a thin passivation layer. When the passivation layer is thin it may crack during thermo-mechanical stress, which leads to electro-migration or thermo-migration.

Electro-migration is a slow wear out phenomenon occurring during high current densities. The impact of moving carriers with stationary metal atoms causes a gradual displacement of the metal. In polycrystalline materials, such as aluminum, electromagnetism causes metal atoms to gradually move away from the crystal boundaries. Although typically occurring at high current densities, a minimum-width lead in a submicron process can experience electro-migration at currents of only a few milliamps. As one primary effect, electro-migration can cause the metal layers to permeate cracks in the isolation layer and create shorting of the transistor.

Thermo-migration is a slow wear out phenomenon occurring during high ambient temperatures governed by the activation energy for metal atoms to diffuse via bulk, surface for grain boundary paths. By this process, metal atoms can also permeate into cracks in isolation layers and create shorting of the transistor.

Some embodiments of the disclosure provide various structures to increase resistance to thermo-mechanical stress and reduce cracking of the passivation layer. The contact interface between the emitter contact 210 and the emitter contact extension 416 includes sloped opposing surfaces 430 in contact with each other. The opposing surfaces transfer lateral thermo-mechanical stress between the contact layers, thus protecting regions of the passivation layer located in between portions of the emitter contact extension 416 electrically coupled to the emitter contact 210.

Figures 1, 5:
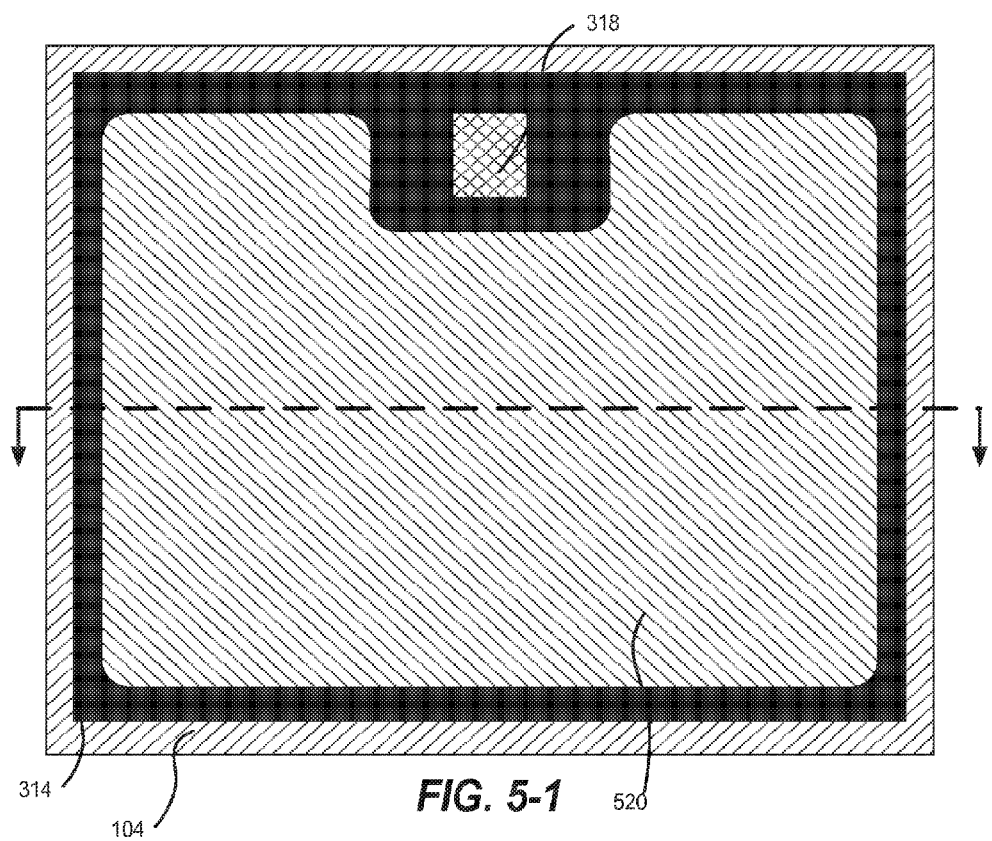
Figures 2, 5:
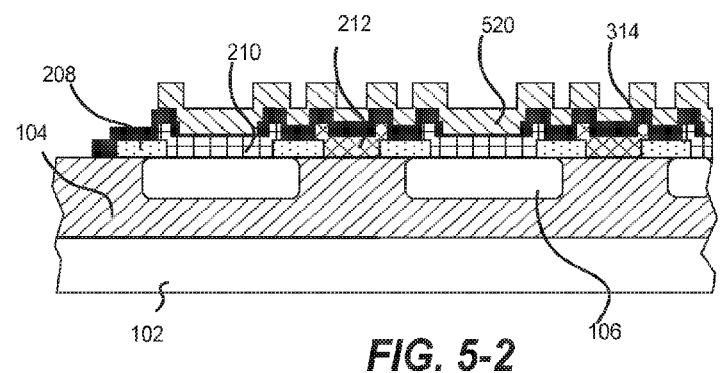

In some additional embodiments of the disclosure, the emitter contact extension 416 is configured to extend over the active area of the bipolar transistor. FIGS. 5-1 and 5-2 illustrate respective top and side views of the bipolar transistor of FIG. 3 with emitter contact extension 520 formed over the active area. In some embodiments, the emitter region 106 encircles the base region 104 in the top surface of the base region. In such embodiments, the sloped opposing surfaces of the interface between the emitter contact 210 and the emitter contact extension 520 form a seal ring around the entire active area. The seal ring prevents lateral forces from thermal expansion occurring outside the active area from affecting the passivation layer inside the seal ring. This architecture allows for the lateral optimization of the emitter resistance by choosing a large contact area for the emitter and a layer thickness to reduce spreading resistance in the contacts, while at the same time increasing robustness to thermo-mechanical forces.

Figures 1, 6:
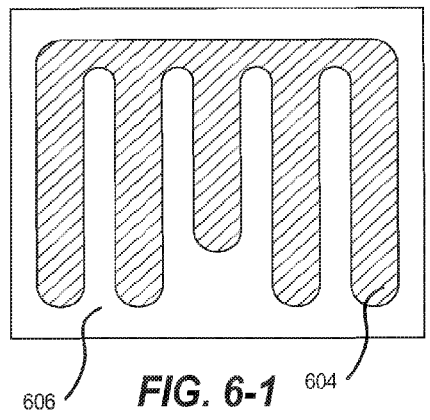
Figures 2, 6:
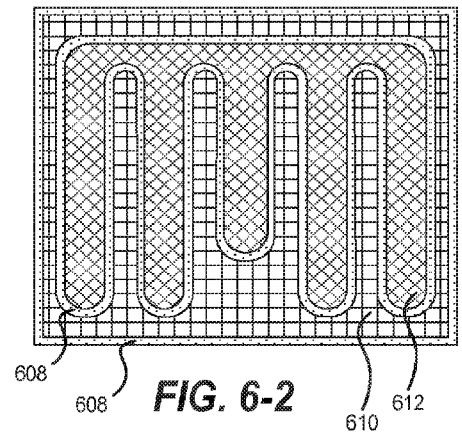
Figures 3, 6:
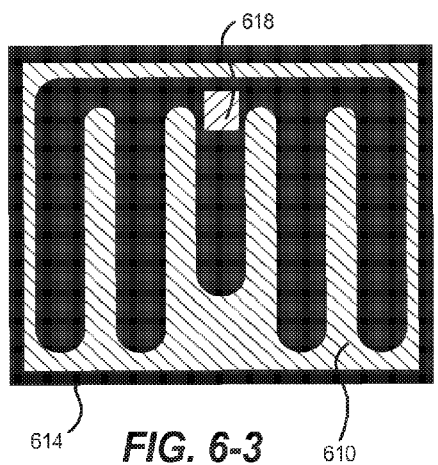
Figures 4, 6:
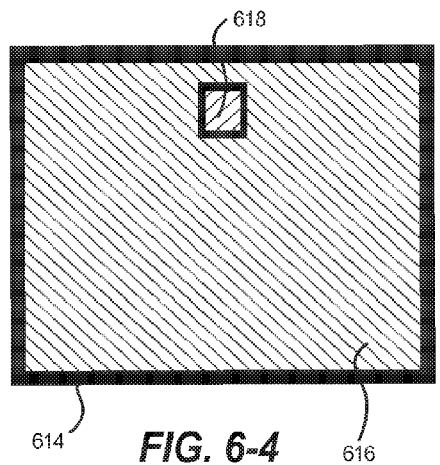

FIGS. 6-1, 6-2, 6-3, and 6-4 illustrate the bipolar transistor configured so emitter region 606 and emitter contact 610 encircle the base region 604 and contact 612. The emitter region is configured to encircle the base region so a seal can be made when emitter contact extension 616 is placed over the active area. FIG. 6-1 illustrates the top view of the bipolar transistor having an emitter region 606 encircling a base region 604 in a top surface of the base region. FIG. 6-2 shows the top view of the bipolar transistor of FIG. 6-1 with emitter contact 610 and base contact 612 placed on top of emitter region 606 and base region 604 respectively. Emitter contact and base contact are isolated by isolation region 608.

FIG. 6-3 illustrates the top view of the bipolar transistor of FIG. 6-2 with extended emitter contact 610 placed over the emitter contact 606. A passivation layer 614 is placed over the active area. A portion of the passivation layer 614 is removed to form base contact pad 618. Emitter contact extension 610 is embedded through passivation layer 614 to couple to emitter contact 610. FIG. 6-4 shows the bipolar transistor of FIG. 6-3 wherein emitter contact extension 616 covers the active area to form a seal ring around the active area.

Embodiments providing a seal ring enhance the ruggedness against thermo-mechanical stresses. As emitter steps do not have to be covered, the robustness of the design is maintained with the emitter contact extension acting as a seal ring. The use of a thin contact layer for contacting the active areas combined with a thick metal top layer used for reduction of the spreading resistance of the emitter contact has advantages in the processability of the device because of the lower step heights and has a positive impact on the device's ruggedness during life time. Because a thin emitter contact layer can be structured easily, line width losses in the etching process are reduced, which results in a larger metallised active area of the device.

The various embodiments described above and shown in the figures are provided by way of illustration only and should not be construed to limit the invention. It is understood that the various embodiments may be combined with any number of semiconductors and any number of semiconductor packages such as surface mount device and small outline transistor packages. Based on the above discussion and illustrations, it will be recognized that the circuits described herein may be manufactured using standard processes and techniques. Those skilled in the art will readily recognize that various modifications and changes may be made to the present invention without strictly following the exemplary embodiments and applications illustrated and described herein. Such modifications and changes do not depart from the true scope of the present invention.

The invention claimed is:

1. A method of constructing a bipolar transistor semiconductor device, comprising:
    forming a first substrate layer including a collector region of a first conductivity type;
    forming a second substrate layer over and on the first substrate layer including a base region of a second conductivity type in an active area of the second substrate layer;
    embedding an emitter region of the first conductivity type in a top surface of the base region;
    depositing a metal emitter contact over and on the emitter region;
    depositing a metal base contact over and on the base region;
    forming an isolation layer over and on the second substrate layer, wherein the isolation layer separates the metal emitter contact and the metal base contact;
    forming a passivation layer over and on the metal base contact and over and on the metal emitter contact region and over and on the isolation layer; and
    depositing a metal emitter contact extension over and on the metal emitter contact region, wherein the metal emitter contact extension extends through an opening in the passivation layer above the metal emitter contact, a bottom surface of the metal emitter contact extension in contact with an upper surface of the metal emitter contact is oriented in a first plane, and the metal emitter contact includes a step extending above the first plane.

2. The method of claim 1, further comprising:
    forming an emitter contact channel in and through the isolation layer in an area above the emitter region; and
    forming a base contact channel in and through the isolation layer in an area above the base region.

3. The method of claim 1, wherein depositing the metal emitter contact extension includes depositing the metal emitter contact extension over and on a portion of the passivation layer.

4. The method of claim 3, wherein the portion of the passivation layer is formed with one or more ridges on a top surface of the passivation layer; and
    the metal emitter contact extension is formed over the one or more ridges.

5. The method of claim 3, wherein
    the emitter region encircles the base region in the top surface, and
    the metal emitter contact extension over the portion of the passivation layer includes a side wall formed over the step of the metal emitter contact.

6. The method of claim 1, wherein depositing the metal emitter contact extension includes depositing the metal emitter contact extension over and on a portion of the passivation layer above the active area.

7. The method of claim 1, further comprising electrically coupling the metal emitter contact extension to a semiconductor package.

8. The method of claim 1, further comprising, forming a base contact channel in and through the passivation layer in an area above the base region.

9. The method of claim 1, wherein the metal emitter contact and the metal emitter contact extension are formed of a metal selected from the group consisting of Al, Al/Si, or Al/Si, or Al/Si/Cu.

10. The method of claim 1, wherein
    the emitter and base regions are comb shaped regions in the top surface, each having two or more teeth oriented in the top surface, and
    the teeth of the emitter and base regions are interleaved.

11. The method of claim 10, wherein
    the two or more teeth of each region have a length equal to at least half of the length of the bipolar transistor semiconductor device.

12. The method of claim 1, wherein
    the bottom surface of the metal emitter contact extension and the upper surface of the metal emitter contact define a horizontal plane, and
    the step of the metal emitter contact and the metal emitter contact extension have opposing vertical surfaces configured to transfer lateral thermo-mechanical stresses between the metal emitter contact and the metal emitter contact extension.

13. The method of claim 12, wherein at least a portion of the passivation layer is located between the opposing vertical surfaces of the step of the metal emitter contact and the metal emitter contact extension.

14. A method of constructing a bipolar transistor semiconductor device, comprising:
forming a first substrate layer including a collector region of a first conductivity type;
forming a second substrate layer over and on the first substrate layer, the second substrate layer including a base region of a second conductivity type in an upper region of the second substrate layer;
embedding an emitter region of the first conductivity type in a top surface of the second substrate layer;
depositing a emitter contact over and on the emitter region;
depositing a base contact over and on the base region;
forming an isolation layer over and on the second substrate layer, wherein the isolation layer separates the emitter contact and the base contact;
forming a passivation layer over and on the base contact and over and on the isolation layer; and
depositing an extension contact over and on the emitter contact, wherein a bottom surface of the extension contact in contact with an upper surface of the emitter contact is oriented in a first plane, and the emitter contact includes a step extending above the first plane.

15. The method of claim 14, wherein
the extension contact overlaps a portion of the passivation layer, and
overlapping portions of the passivation layer and the extension contact include sloped opposing surfaces in contact with each other.

16. The method of claim 15, wherein
the sloped opposing surfaces are sloped in a vertical direction, and
the step of the emitter contact and the extension contact each are oriented in a second plane that is parallel to the first plane.

17. The method of claim 16, wherein
the extension contact is separated from the step of the emitter contact by a portion of the passivation layer.

18. The method of claim 14, wherein
the passivation layer overlaps the step of the emitter contact, and
overlapping portions of the passivation layer and the step include sloped opposing surfaces in contact with each other.

19. The method of claim 14, wherein
the base contact includes a step extending above the first plane, and
the extension contact has a vertical thickness of at least 1.0 μm.

20. The method of claim 14, wherein
the extension contact is vertically at least twice as thick as the emitter contact.

* * * * *